US009786578B2

(12) United States Patent
Cox et al.

(10) Patent No.: US 9,786,578 B2
(45) Date of Patent: Oct. 10, 2017

(54) ORTHOGONALLY HINGED INDIVIDUALIZED MEMORY MODULE COOLING

(71) Applicant: Lenovo Enterprise Solutions (Singapore) Pte. Ltd., Singapore (SG)

(72) Inventors: Aaron R. Cox, Tucson, AZ (US); William J. Grady, Cary, NC (US); Jason A. Matteson, Raleigh, NC (US); Jason E. Minyard, Phoenix, AZ (US)

(73) Assignee: LENOVO ENTERPRISE SOLUTIONS (SINGAPORE) PTE. LTD., Singapore (SG)

( * ) Notice: Subject to any disclaimer, the term of this patent is extended or adjusted under 35 U.S.C. 154(b) by 202 days.

(21) Appl. No.: 14/164,986

(22) Filed: Jan. 27, 2014

(65) Prior Publication Data

US 2015/0212555 A1 Jul. 30, 2015

(51) Int. Cl.
*H01L 23/427* (2006.01)
*H01L 23/473* (2006.01)
(Continued)

(52) U.S. Cl.
CPC ........ *H01L 23/473* (2013.01); *F28D 15/0266* (2013.01); *F28D 15/0275* (2013.01);
(Continued)

(58) Field of Classification Search
CPC ... G06F 1/20; G06F 2200/201; H01L 23/473; H01L 23/4093; H01L 23/427;
(Continued)

(56) References Cited

U.S. PATENT DOCUMENTS 6,188,576 B1 * 2/2001 Ali .................. G06K 19/077
174/17 R
6,278,610 B1 * 8/2001 Yasufuku ............ H05K 7/1431
165/185

(Continued)

FOREIGN PATENT DOCUMENTS

WO WO2011053313 5/2011

OTHER PUBLICATIONS

Heejin Lee et al., "Thermal Management of High Power Memory Module", 2006 IEEE.

*Primary Examiner* — Dimary Lopez Cruz
*Assistant Examiner* — Matt Dhillon
(74) *Attorney, Agent, or Firm* — Jason Friday; Andrew M. Calderon; Roberts Mlotkowski Safran Cole & Calderon, P.C.

(57) ABSTRACT

A memory module cooling system includes a liquid cooled manifold assembly and a heat spreader assembly rotateably attached to the liquid cooled manifold assembly about an axis perpendicular to the memory module. The liquid cooled manifold assembly includes a manifold, an liquid inlet, and a liquid outlet. The heat spreader assembly includes a base in thermal contact with a heat pipe, and a heat spreader in thermal contact with the heat pipe, the heat spreader configured to thermally engage the memory module. In certain embodiments, thermal bonds are maintained between a plurality of neighboring memory modules when a particular heat spreader assembly is rotated away from an associated memory module.

20 Claims, 9 Drawing Sheets

(51) Int. Cl.
  *H01L 23/40* (2006.01)
  *F28D 15/02* (2006.01)
  *F28F 1/20* (2006.01)
  *H05K 7/20* (2006.01)

(52) U.S. Cl.
  CPC ............ *F28F 1/20* (2013.01); *H01L 23/4093* (2013.01); *H01L 23/427* (2013.01); *H05K 7/20509* (2013.01); *F28F 2275/08* (2013.01); *Y10T 29/49117* (2015.01)

(58) Field of Classification Search
  CPC .... H05K 7/20509; F28F 1/20; F28F 2275/08; F28D 15/0266; F28D 15/0275; Y10T 29/49117
  USPC .......................... 361/679.32, 679.47; 165/173
  See application file for complete search history.

(56) References Cited

U.S. PATENT DOCUMENTS

| | | | | |
|---|---|---|---|---|
| 6,890,203 B2 * | 5/2005 | Matsunaga | ........... | H01R 4/5066 139/326 |
| 7,106,595 B2 * | 9/2006 | Foster, Sr. | ............. | G06F 1/185 165/80.3 |
| 7,372,702 B2 * | 5/2008 | Gauche | .................. | G06F 1/203 257/724 |
| 7,639,498 B2 | 12/2009 | Campbell et al. | | |
| 7,855,888 B2 * | 12/2010 | Peterson | ............. | F28D 15/0275 165/104.33 |
| 7,907,398 B2 | 3/2011 | Hrehor et al. | | |
| 7,969,736 B1 * | 6/2011 | Iyengar | .................. | H01L 23/36 165/104.33 |
| 7,990,699 B2 * | 8/2011 | Lian | .................... | F28D 15/0275 165/104.21 |
| 8,081,473 B2 * | 12/2011 | Cipolla | ............... | H01L 23/4093 165/104.33 |
| 8,570,744 B2 * | 10/2013 | Rau | ........................ | G06F 1/20 361/679.52 |
| 8,599,557 B2 * | 12/2013 | Peterson | ................... | G06F 1/20 165/104.21 |
| 8,659,897 B2 * | 2/2014 | Meijer | ...................... | G06F 1/20 361/679.32 |
| 2008/0123300 A1 * | 5/2008 | Tian | ........................ | G11C 5/04 361/721 |
| 2008/0291630 A1 * | 11/2008 | Monh | ................ | F28D 15/0266 361/700 |
| 2009/0190303 A1 * | 7/2009 | Chu | ........................ | G06F 1/20 361/679.47 |
| 2009/0190304 A1 * | 7/2009 | Meyer, IV | ................ | G06F 1/20 361/679.47 |
| 2009/0284924 A1 * | 11/2009 | Konshak | ............. | H05K 7/20672 361/700 |
| 2010/0025010 A1 * | 2/2010 | Cipolla | ............... | H01L 23/4093 165/47 |
| 2013/0027870 A1 | 1/2013 | Ries et al. | | |
| 2013/0120926 A1 | 5/2013 | Ni et al. | | |
| 2013/0135812 A1 | 5/2013 | Barina et al. | | |
| 2013/0194745 A1 | 8/2013 | Meijer et al. | | |

\* cited by examiner

ORTHOGONALLY HINGED INDIVIDUALIZED MEMORY MODULE COOLING

FIELD

Embodiments of invention generally relate to memory modules, such as a dual inline memory module (DIMM), electronic systems that may utilize memory modules, and more particularly to orthogonally hinged individualized memory module cooling.

DESCRIPTION OF THE RELATED ART

Liquid cooled memory modules utilized by current information technology and computing products are difficult to service. Heat spreaders, heat pipes, and liquid coolant lines that attach to memory modules are often permanently fixed together or require specialized tools to install or remove. This complicates and lengthens service time. Coupling of liquid coolant lines to memory module cooling apparatuses also introduce potential leak points inside the system.

In certain current cooling apparatuses, a heat pipe is captured and generally fixed in place between cooling plates for cooling an intermediary memory module. Specialized tools are required to remove the cooling plates from the both the memory module and the heat pipe.

Still in certain other current cooling apparatuses, compressible cooling plates are generally fixed within the system and may lack adequate compression forces to ensure sufficient surface contact between the compressible cooling plate and the memory module that would otherwise allow for increased thermal loads.

In other current cooling systems, such as taught by Rau et al., (US 20120113586), a single mechanism is utilized to cool an entire bay of memory modules, requiring that a thermal bond between the entire bay of memory modules and the cooling system is broken when servicing a particular memory module.

Figure 1A:
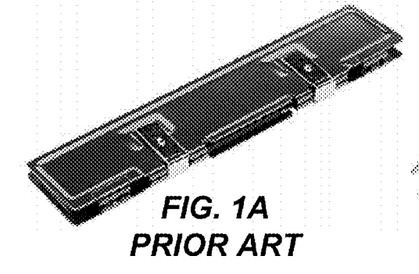
FIG. 1A-FIG. 1F depict various known memory module cooling apparatuses.
Figure 1B:
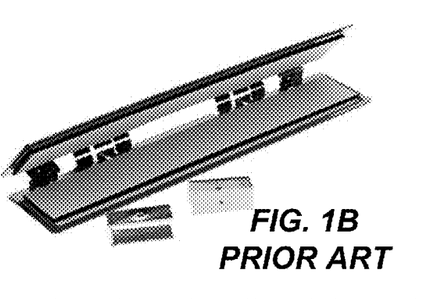
Figure 1C:
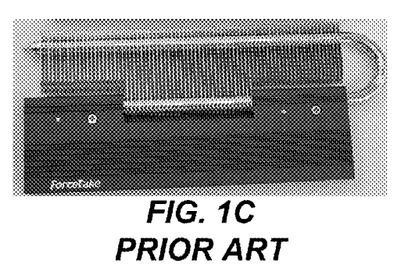
Figure 1D:
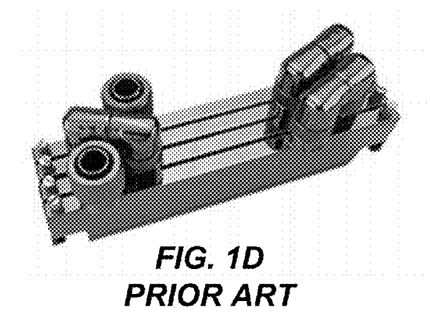
Figure 1E:
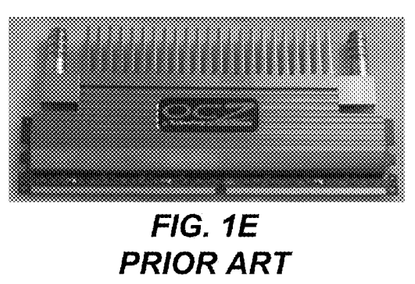
Figure 1F:
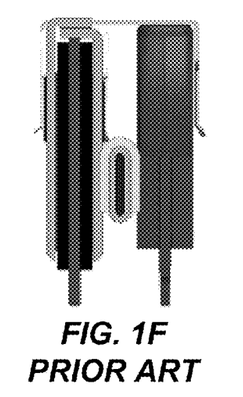

Further, common water cooled memory module cooling systems, such as those depicted in FIG. 1D and FIG. 1E, use local liquid couplers which introduce leak points within the system, requires interruption of the cooling loop in order to service a particular memory module, and requires specialized tools to remove the cooling system from the memory module. Air cooled options, such as those shown in FIG. 1A, FIG. 1B, and FIG. 1C, have limited cooling capacity. In other cooling systems, such as shown in FIG. 1F, a pair based cooling assembly cools multiple memory modules and requires the removal of the pair of memory modules in order to service a particular memory module.

SUMMARY

In a first embodiment of the present invention, a memory module cooling system includes a liquid cooled manifold assembly and a heat spreader assembly rotateably attached to the liquid cooled manifold assembly about an axis perpendicular to the memory module. The liquid cooled manifold assembly includes a manifold, an liquid inlet, and a liquid outlet. The heat spreader assembly includes a base in thermal contact with a heat pipe, and a heat spreader in thermal contact with the heat pipe, the heat spreader configured to thermally engage the memory module. In certain embodiments, thermal bonds are maintained between a plurality of neighboring memory modules when a particular heat spreader assembly is rotated away from an associated memory module.

In another embodiment of the present invention, a memory module cooling system installation method includes: seating a memory module to a system board assembly; rotating the heat spreader assembly relative to the liquid cooled manifold assembly about an axis perpendicular to the memory module, and; juxtapositionally contacting the base with a liquid cooled manifold assembly engagement recess feature.

In another embodiment of the present invention, a memory module cooling system removal method includes: removing a compression sleeve from a heat spreader of a heat spreader assembly; rotating the heat spreader assembly relative to a liquid cooled manifold assembly about an axis perpendicular to the memory module, and; unseating the memory module from a system board assembly.

These and other embodiments, features, aspects, and advantages will become better understood with reference to the following description, appended claims, and accompanying drawings.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION

Details of the claimed embodiments are disclosed herein. However, it is understood that the disclosed embodiments are merely illustrative of the structures, devices, systems, methods, etc. that may be embodied in various forms. These exemplary embodiments are provided so that this disclosure will be thorough and complete and will convey the scope of this invention to those skilled in the art. In the description, details of well-known features and techniques may be omitted to avoid unnecessarily obscuring the presented embodiments.

The drawings are not necessarily to scale. The drawings are merely schematic representations, not intended to portray specific parameters of the invention. The drawings are intended to depict only exemplary embodiments of the invention. In the drawings, like numbering represents like elements.

Figure 2:
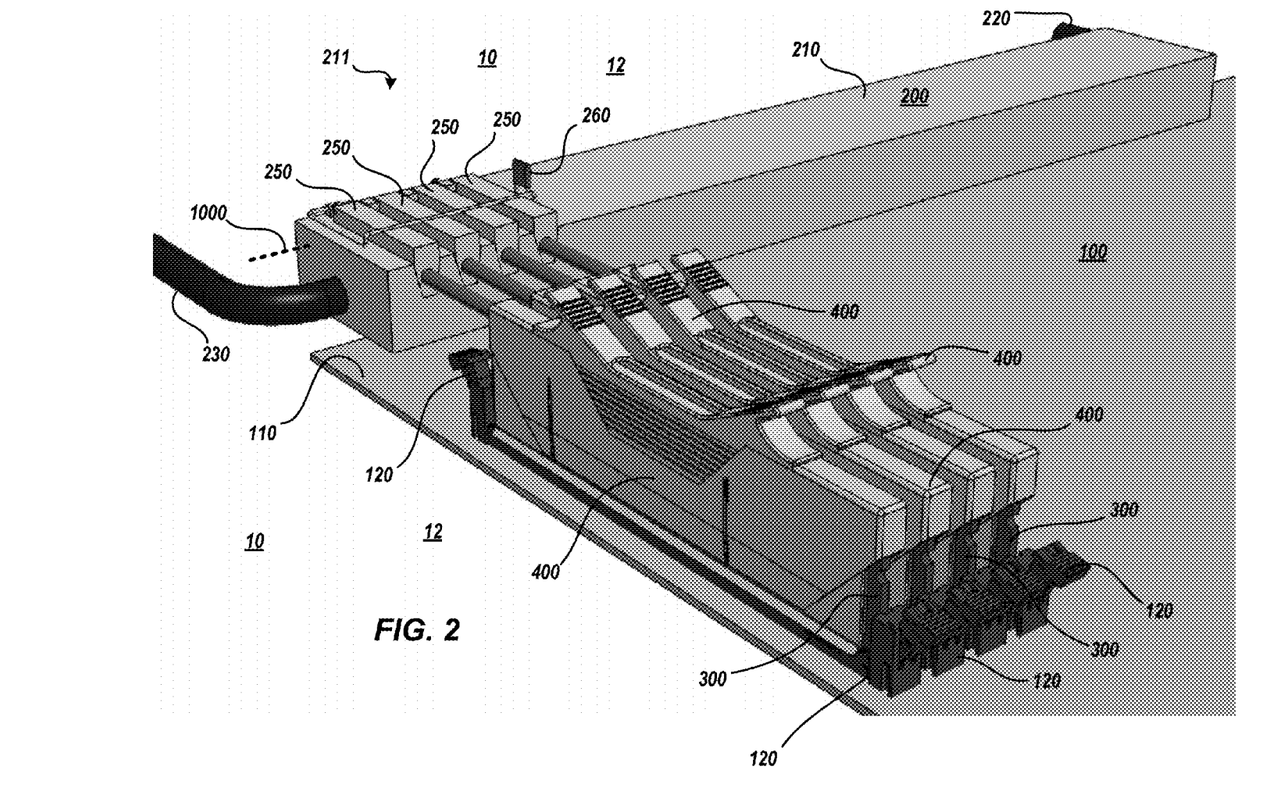
FIG. 2 depicts an orthogonally hinged individualized memory module cooling system, according to various embodiments of the present invention.
Figure 3:
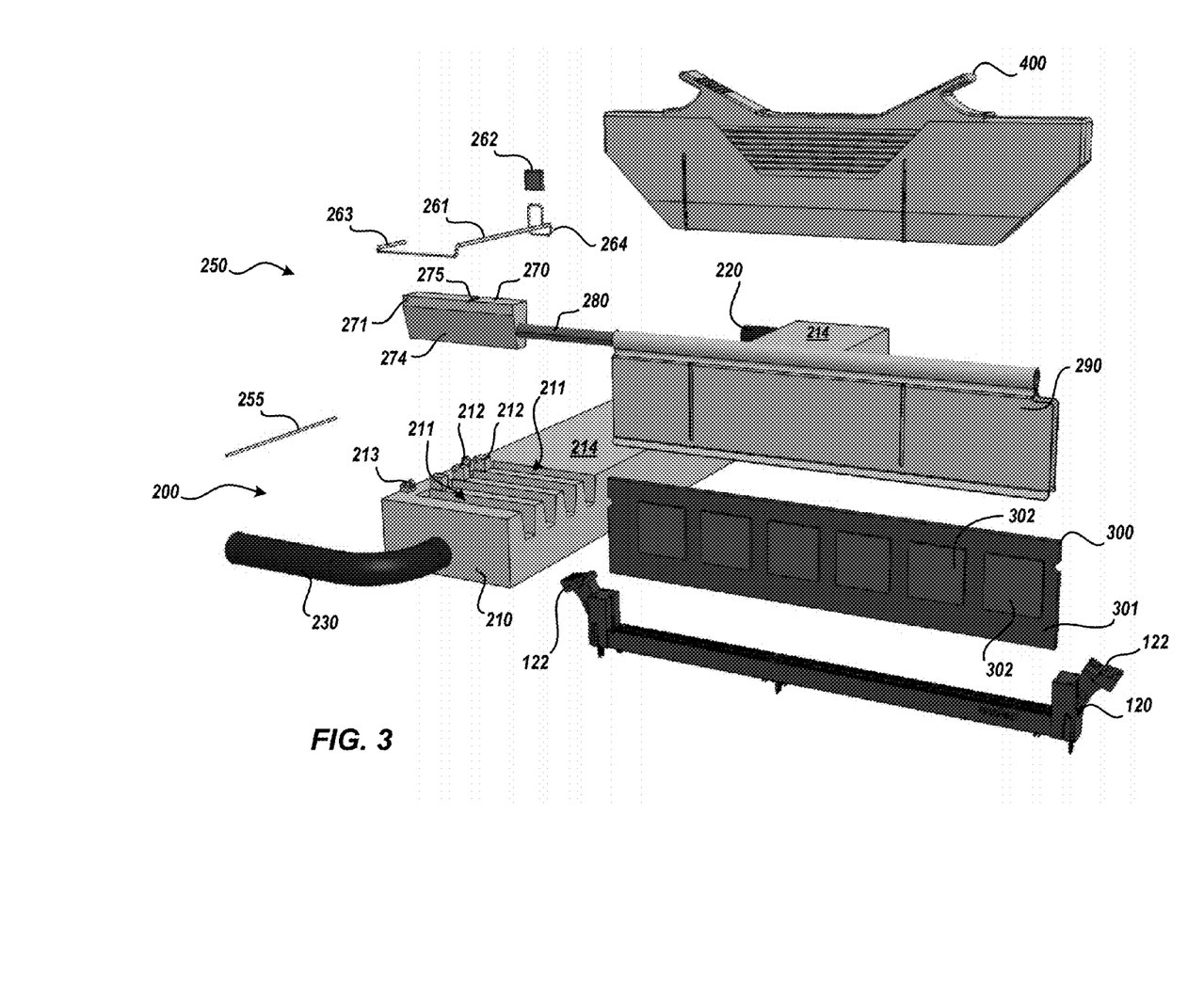
FIG. 3 depicts an exploded view of various orthogonally hinged individualized memory module cooling system components, according to various embodiments of the present invention.

Referring to at least one of FIG. 2 or FIG. 3, in various embodiments, orthogonally hinged individualized memory module cooling system 10 may include an electronic system chassis 12, a system board assembly 100, a manifold assembly 200, one or more heat spreader assemblies 250, a heat spreader retention system 260, one or more memory modules 300, and/or one or more compression sleeves 400.

In the various embodiments of the present invention, the electronic system may take various forms that utilize numerous electronic circuits and components designed to accomplish one or more complex functions. Such forms may be e.g. telecommunication systems, computer systems, power distribution systems, radar systems, electronic music systems, etc. Chassis 12 may consist of a metal frame on which various electronic system components such as circuit boards and other electronics may be mounted. For example, chassis 12 may be a sheet metal frame on to which a motherboard, disk drives, power supply units, and other equipment are affixed. The chassis 12 may protect the internal equipment from dust, moisture, and tampering and may therefore generally have various perimeter surfaces (front, back, top, bottom, etc.). For example, memory modules may be installed or removed from the electronic system by removing a top cover of chassis 12. In various FIGs. of the embodiments of the present invention, chassis 12 is removed so that other system 10 components may be visible.

System board assembly 100 includes a system board, mother board, etc. that is a printed circuit board and holds many of the crucial electronic components of the electronic system, such as a central processing unit (CPU), memory modules 300, and provides connectors for other peripherals. The system board provides electrical connections by which components of the electronic system communicate. The system board may include sockets in which one or more microprocessors may be installed, connectors 120 into which the memory modules 300 memory may be installed, a chipset which forms an interface between the CPU, memory, etc., non volatile memory containing the system's firmware or BIOS, a clock to synchronize the various components, slots for expansion cards, power supply connectors, etc. System board assembly 100 may also include other components attached the system board, such as e.g., video cards, network cards, hard drives, or other forms of persistent storage, television tuner cards, cards providing extra input output slots and a variety of other custom components.

Manifold assembly 200 includes a manifold 210, an inlet 220, and an outlet 230. Manifold 210 is generally a thermally conductive mass with one or more engagement features 211 to allow for heat transfer between one or more heat spreader assemblies 250 and manifold 210. In certain embodiments, engagement feature 211 is generally a receptacle within manifold 210 (as shown e.g. in FIG. 2, etc.). In certain other embodiments, engagement feature 211 is generally a protrusion from manifold 210. Manifold 210 includes a passage (e.g. an internal passage, a serpentine passage, etc.) so that liquid received at inlet 220 may be passed to outlet 230. Manifold 210 may be a multipart component. For example, manifold 210 may include two half portions affixed together. For clarity, the orientation of inlet 220 and outlet 230 is merely exemplary. In certain embodiments, manifold 210 may include one or more hinge supports 212 to mechanically support axle 255. In certain embodiments, similar to that shown in FIG. 3, hinge supports 212 may protrude from manifold 210 and may be generally above a top surface 214 of manifold 210. In other embodiments, hinge supports 212 may be internal or be otherwise recessed within manifold 210 and may be generally below top surface 214. Further, in various embodiments, manifold 210 may also include one or more retention supports 213 for mechanically retaining heat spreader retention system 260 to manifold 210, to provide a fastening surface to heat spreader retention system 260, etc.

In various embodiments, during operation of the electronic system, cooled liquid flows, is accepted, forced, or otherwise enters inlet 220 thereby cooling manifold 210. Heat generated from memory module 300 flows to heat spreader assembly 250 and subsequently to manifold 210 thereby warming the liquid within the passage(s) of manifold 210. The warmed liquid exits manifold 210 via outlet 230.

Heat spreader assembly 250 includes a manifold engagement base 270, heat pipe 280, and a heat spreader 290. Base 270 is generally a thermally conductive mass configured to interact with engagement features 211. For example, in certain embodiments where engagement feature 211 is generally a receptacle within manifold 210, base 270 fits within such receptacle or where engagement feature 211 is generally a protrusion from manifold 210, base 270 accepts such protrusion. When engaged with engagement features 211, base 270 is in thermal contact with manifold 210, such that heat may be transferred from base 270 to manifold 210. In certain embodiments, base 270 may include an opening 271 to accept axle 255 and may include an orthogonal recess 275 for accepting traversing feature 261.

In certain embodiments, heat pipe 280 may be a heat transfer device that combines both thermal conductivity and phase transition to transfer heat between heat spreader 290 and base 270. At a hot interface (i.e. heat spreader 290 and heat pipe 280) a liquid internal to heat pipe 280 is in contact with a thermally conductive solid surface of heat pipe 280 whereby the water turns into a vapor by absorbing heat from that surface. The vapor then travels along heat pipe 280 to a cold interface (i.e. base 270 and heat pipe 280) and condenses back into a liquid, thereby releasing latent heat. The liquid then returns to the hot interface through capillary forces, centrifugal force, or gravity, and the cycle repeats. In other embodiments, heat pipe 280 may be a solid thermally conductive material such as copper or aluminum. Heat pipe 280 is in thermal contact with base 270, such that heat may be transferred from heat pipe 280 to base 270. For clarity, though shown in the FIGs. as generally rod shaped, heat pipe 280 may be configured to take the form of other geometries.

In certain embodiments, heat spreader 290 may be a thermally conductive dual walled a heat dissipation device wherein the first wall may thermally contact a first side of memory module 300 and wherein the second wall may thermally contact an opposing second side of memory module 300. Heat spreader 290 is in thermal contact with heat pipe 280, such that heat may be transferred from memory module 300 to heat spreader 290. In various embodiments, heat spreader 290 may be made from sheet metal, etc.

In certain embodiments, system 10 includes a heat spreader retention system 260 that may be engaged to restrict movement of one or more heat spreader assemblies 250 relative to manifold assembly 200 and may be disengaged to allow for movement of one or more heat spreader assemblies 250 relative to manifold assembly 200. In certain embodiments heat spreader retention system 260 may include a traversing feature 261 that traverses one or more heat spreader assemblies 250, an axle feature 263 to engage with a first retention support 213 to allow for relative rotation between heat spreader retention system 260 and manifold 210, a latch feature 264 to engage with a second retention support 213 to prevent relative rotation between heat spreader retention system 260 and manifold 210. In certain embodiments, heat spreader retention system 260 may include a usability surface cap or feature 262 to highlight a touch point to a user of the electronic system, to provide a smooth usability surface to the user, etc.

Memory module 300 includes a circuit board 301 and a plurality of memory devices 302. Typically, memory devices 302 may be included on opposing sides of circuit board 301. In various embodiments, memory module 300 may be a dual in-line memory module (DIMM), a TransFlash memory module, a single in-line pin package memory module, a single in-line memory module, small outline DIMM, or other such equivalent memory modules.

Compression sleeve 400 is a dual walled sleeve wherein a first wall is separated by a second wall by a central opening. The first wall and the second wall are generally rigid relative thereto. The compression sleeve may engage with heat spreader 290 to force heat spreader 290 into thermal contact with memory module 300 so that heat may be removed from memory module 300. In various embodiments, compression sleeve 400 may be made from molded plastic, etc.

In various embodiments of the present invention, one or more heat spreader assemblies 250 may be attached to manifold assembly 200 with an axel 255. Axel 255 may be a rod or spindle that may be either fixed or rotating that passing through one or more hinge supports 212 and one or more openings 271. Axel 255 allows for the retention or attachment of one or more heat spreader assemblies 250 to manifold assembly 200 but allows for relative rotation there between. As such, in various embodiments of the present invention, heat spreader assembly 250 may rotate relative to manifold assembly 200 or other generally affixed components (such as system board assembly 100, etc.) about an axis 1000 that is substantially orthogonal to the orientation of memory modules 300.

Figure 4:
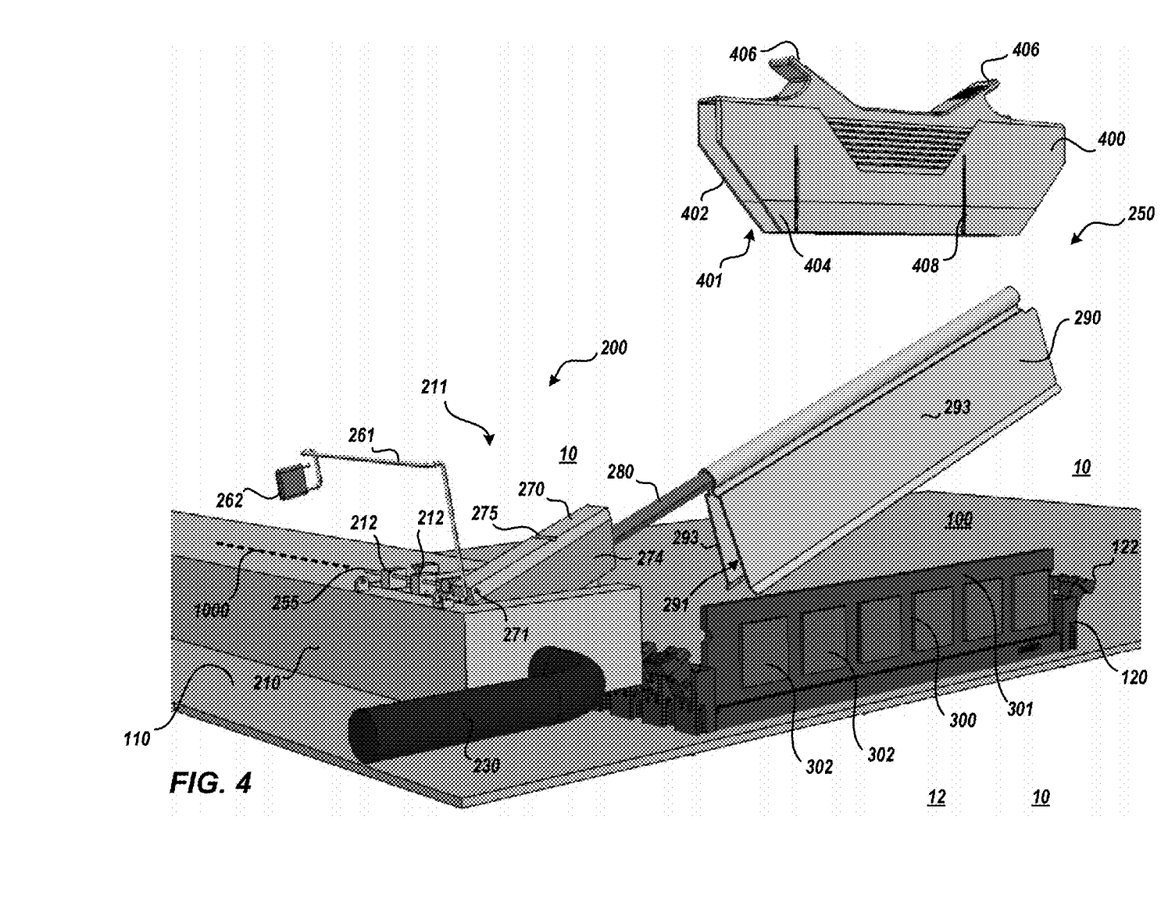
FIG. 4 depicts an exploded exemplary installation view of various orthogonally hinged individualized memory module cooling system components, according to various embodiments of the present invention.
Figure 5:
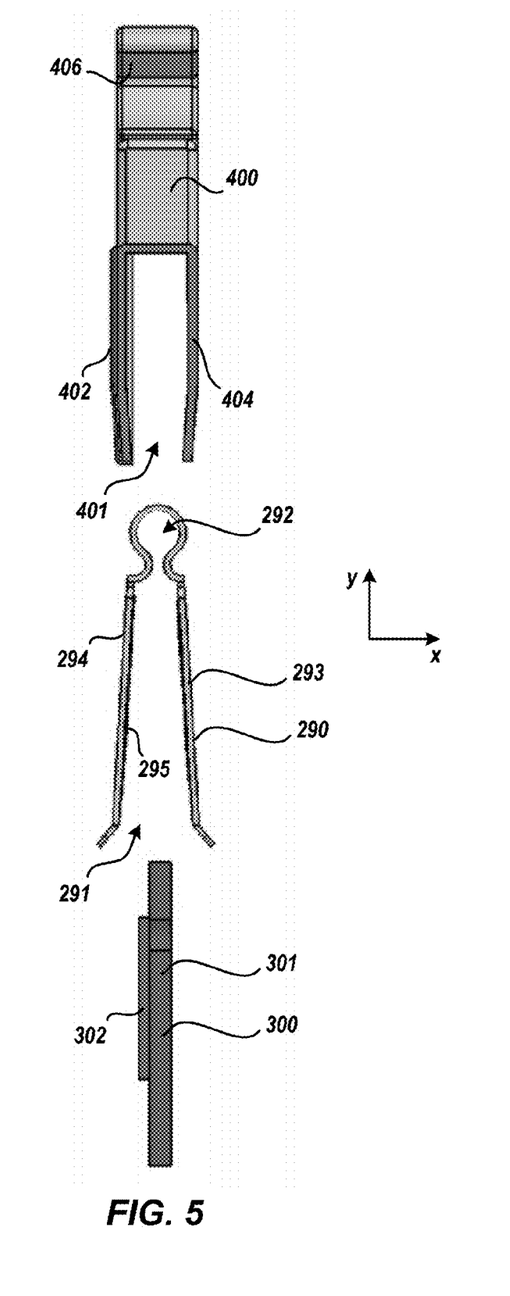
FIG. 5-FIG. 6 depict exploded views of various orthogonally hinged individualized memory module cooling system components, according to various embodiments of the present invention.
Figure 6:
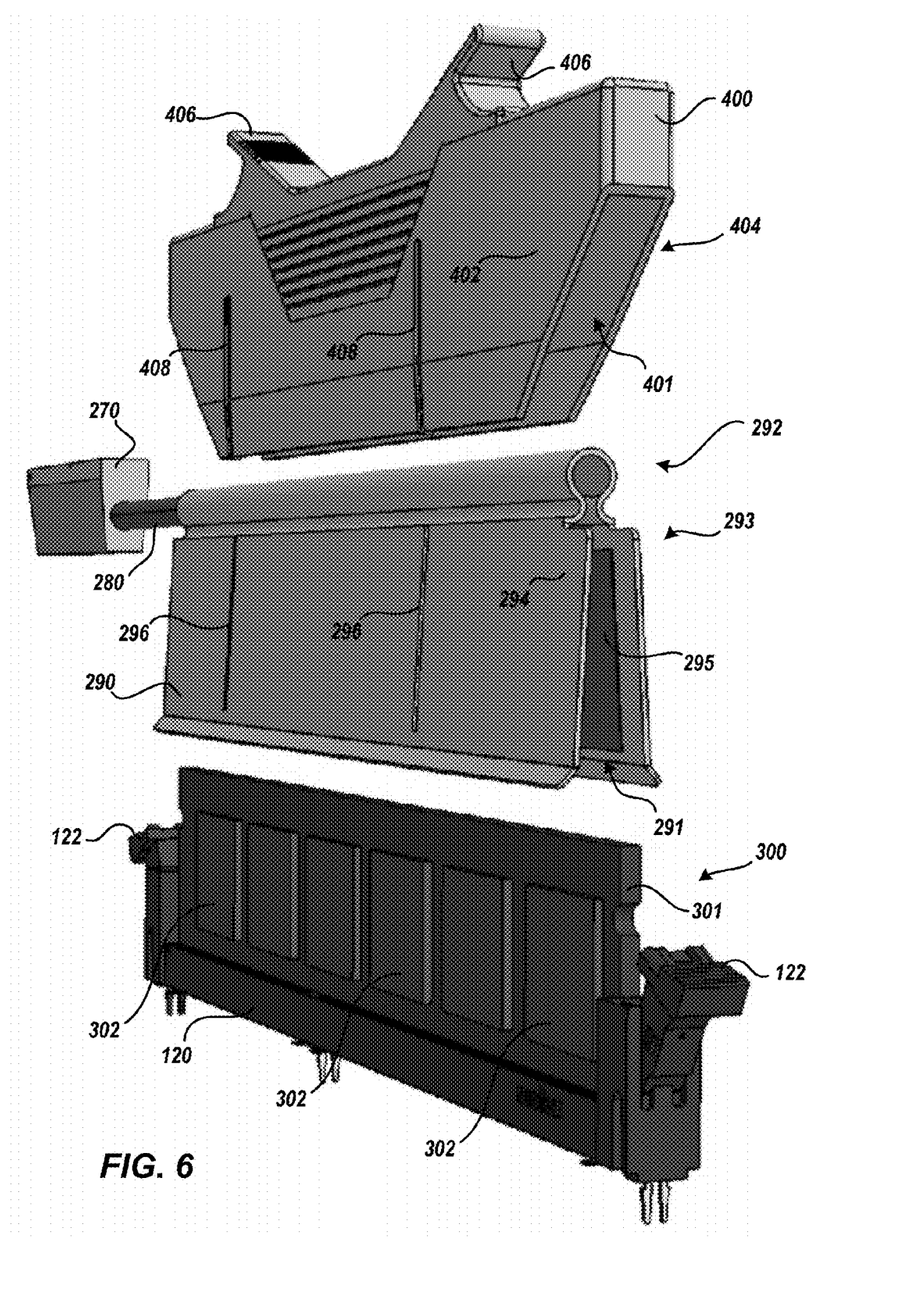

Referring now to FIG. 4-FIG. 6. In certain embodiments, as shown in FIG. 4, memory module 300 may be installed or otherwise engaged with system board assembly 100. For example, a DIMM memory module is inserted or seated into connector 120 such that electrical contact is made between the DIMM memory module and connector 120. In certain embodiments, tabs 122 may be utilized to retain memory module 300. For example, tabs 122 may fit within one or more notches of circuit board 301. Tabs 122 may be configured to automatically engage and retain memory module 300 upon memory module 300 becoming fully seated with connector 120.

In various embodiments, heat spreader assembly 250 is rotated toward memory module 300 about axis 1000. Heat spreader assembly 250 may be engaged by, for example, rotating the heat spreader assembly 250 whereby a central opening 291 accepts memory module 300 such that a first wall 293 covers a side of memory module 300 and a second wall 294 covers an opposing side of memory module 300. In certain embodiments, heat spreader assembly 250 is fully rotated when heat spreader 290 is generally parallel to circuit board 101 and/or when base 270 forms a juxtapositional contact 1002 with engagement feature 211 (e.g. the majority of the perimeter surfaces of base 270 contact with engagement feature 211, the perimeter surfaces of base 270 are coincident with engagement feature 211, etc.).

In certain embodiments, heat spreader assembly 250 also includes a thermal interface layer 295 upon the inner surface of wall 293 and or wall 294. Thermal interface layer 295 is a thermally conductive material and may be generally compressible such that the layer may be compressed to ensure thermal contact with memory module 300. In certain embodiments, heat spreader 290 includes a transverse opening 292 along the length of heat spreader 290 to accept heat pipe 280. Heat spreader 290 may be attached to heat pipe 280 with, for example, a thermally conductive adhesive, grease, etc. at the junction between opening 292 and heat pipe 280. In certain embodiments, heat spreader 290 includes one or more alignment features 296 such as an emboss or recess that guides or otherwise ensures proper compression sleeve 400 installation direction during engagement or installation upon heat spreader 290.

In various embodiments, heat spreader retention system 260 engage with heat spreader assembly 250 to prevent movement relative to manifold assembly 200. For example, heat spreader retention system 260 may be rotated toward heat spreader system 260 such that traversing feature 261 traverses heat spreader assembly 250. Heat spreader system 260 may be rotated until traversing feature 261 is accepted by orthogonal recess 275. Subsequently, latch feature 264 may be engaged with retention support 213 to prevent relative rotation between heat spreader retention system 260 and manifold 210.

In various embodiments, compression sleeve 400 engages with heat spreader 290 to force heat spreader 290 into thermal contact with memory module 300 so that heat may be removed from memory module 300. For example, compression sleeve 400 is vertically lowered upon heat spreader 290 whereby a central opening 401 accepts heat spreader 290 such that a first wall 402 covers wall 294 and a second wall 404 covers wall 293. In certain embodiments, walls 402 and 404 are rigid relative to walls 293 and 294. When engaged, therefore, wall 402 flexes wall 294 and thereby forces an opposing side of wall 294 into thermal contact with memory module 300 and wall 404 flexes wall 293 and thereby forces an opposing side of wall 293 into thermal contact with memory module 300. In other words, compression sleeve 400 compresses walls 293 and 294 inward toward each other to ensure thermal contact between heat spreader 290 and memory module 300. In certain embodiments, compression sleeve 400 may also include one or more handling tabs 406 to allow a user to grasp or otherwise handle compression sleeve 400 and or one or more alignment features 408 such as a emboss or recess that guides or otherwise ensures proper installation direction during the engagement or installation of compression sleeve 400 upon heat spreader 290. Alignment features 296 and alignment features 408 may be fit or otherwise engage with each other to ensure proper installation direction during the engagement or installation of compression sleeve 400 upon heat spreader 290. For example, as shown in FIG. 6, alignment features 296 and alignment features 408 are arranged vertically and engage with each other to force both a proper horizontal positioning and vertical installation direction of compression sleeve 400 upon heat spreader 290.

Figure 7:
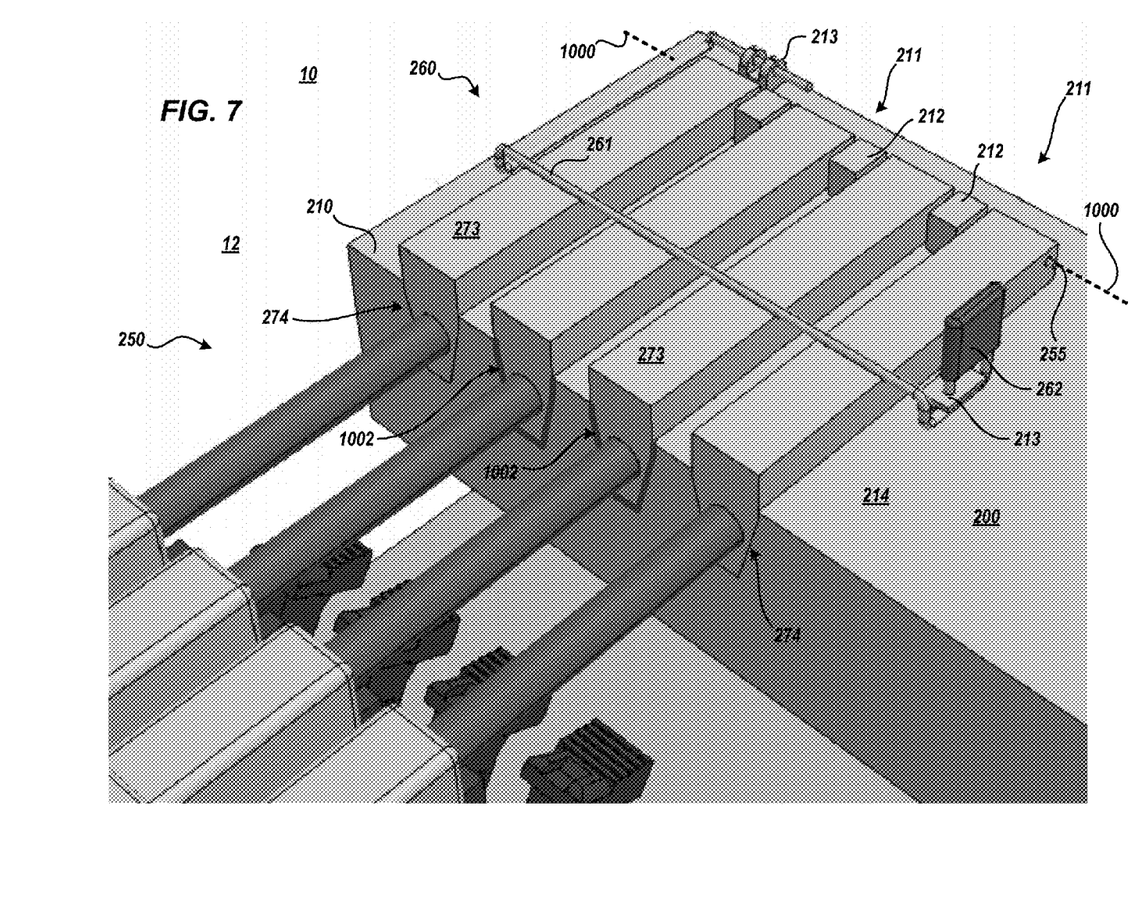
FIG. 7 depicts a detailed view of various orthogonally hinged individualized memory module cooling system components, according to various embodiments of the present invention.

FIG. 7 depicts a detailed view of various orthogonally hinged individualized memory module cooling system 10 components, according to various embodiments of the present invention. In various embodiments, heat spreader assembly 250 is rotated toward memory module 300 about axis 1000 and base 270 fits with engagement features 211 to form a juxtapositional contact 1002 with engagement feature 211. For example, a majority of the perimeter surfaces of base 270 contact with engagement feature 211, the majority of the perimeter surfaces of base 270 are coincident with engagement feature 211, etc. In certain embodiments, as shown in FIG. 7, engagement feature 211 may be an opening or recess within manifold 210 and base 270 may be configured to fit within the opening. To ease the insertion of base 270 within the opening, base 270 may include tapers 274 such that a bottom width of base 270 is less than a top width of base 270. In various embodiments, base 270 may be arranged in various shapes and engagement feature 211 is configured relative thereto to maintain juxtapositional contact 1002. Therefore, if base 270 includes tapers 274, engagement feature 211 may be arranged as a recess with a corresponding shape, e.g. bottom width less than a top width, etc. In various embodiments, juxtapositional contact 1002 allows for heat transfer from base 270 to manifold 210. In certain embodiments, as shown in FIG. 7, a top surface 273 of base 270 may protrude may be generally above top surface 214 of manifold 210. In other embodiments, base 270 may be configured such that top surface 273 may be coplanar with top surface 214 of manifold 210.

Figure 8:
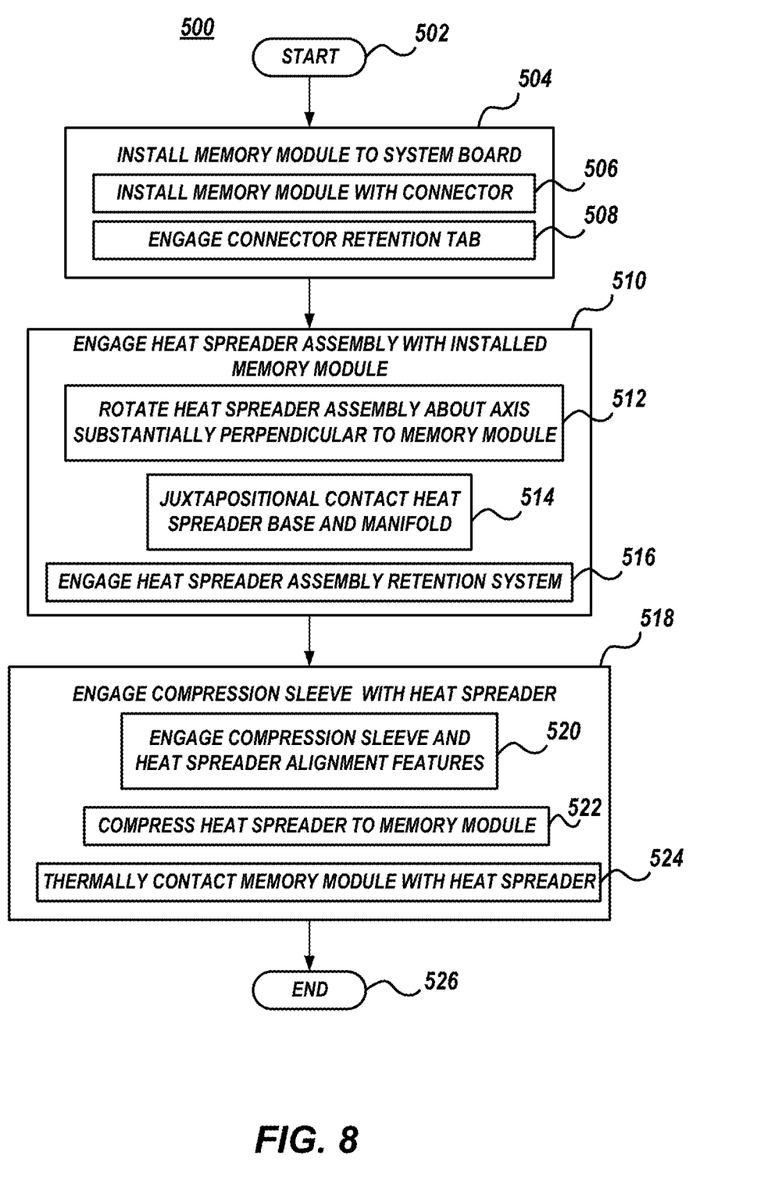
FIG. 8 depicts a block diagram of a method of installing orthogonally hinged individualized memory module cooling system components, according to various embodiments of the present invention.

FIG. 8 depicts a block diagram of a method 500 of installing orthogonally hinged individualized memory module cooling system 10 components, according to various embodiments of the present invention. Method 500 begins at block 502 and continues with installing memory module 300 to system board assembly 100 (block 504). For example, the memory module 300 may be seated to connector 120 (block 506) and the retention tab 122 may be engaged with e.g. a recess in circuit board 301 (block 508).

Method 500 continues with engaging heat spreader assembly 250 with the installed memory module 300 (block 510). For example, heat spreader assembly 250 is rotated about axis 1000 that is substantially perpendicular to the installed memory module 300 (block 512). For example, heat spreader assembly 250 is rotated about axis 1000 whereby opening 291 accepts memory module 300. A juxtapositional contact 1002 is formed between base 270 and engagement features 211 of manifold 210 (block 514). To restrict further relative movement between heat spreader assembly 250 and manifold 210, heat spreader retention system 260 is engaged (block 516). For example, heat spreader retention system 260 is rotated such that traversing feature 261 traverses heat spreader assembly 250 and latch feature 264 is latched with retention support 213, etc.

Method 500 continues with engaging compression sleeve 400 with heat spreader 290 (block 518). For example, compression sleeve may be generally vertically lowered such that heat spreader 290 is accepted by opening 401. Alignment feature 296 and alignment feature 408 alignment features 296 engage with each other to force both a proper horizontal positioning and installation direction of compression sleeve 400. Compression sleeve 400 forces wall 293 and wall 294 inward (block 522) so that walls 293 and 294 thermally contact memory module 300 (block 524). Method 500 ends at block 526. In various embodiments, method 500 may be performed without the need or use of installation tools. Therefore, the memory module installation embodiments of method 500 may be referred to as a tool-less installation of a memory module from orthogonally hinged individualized memory module cooling system 10.

Figure 9A:
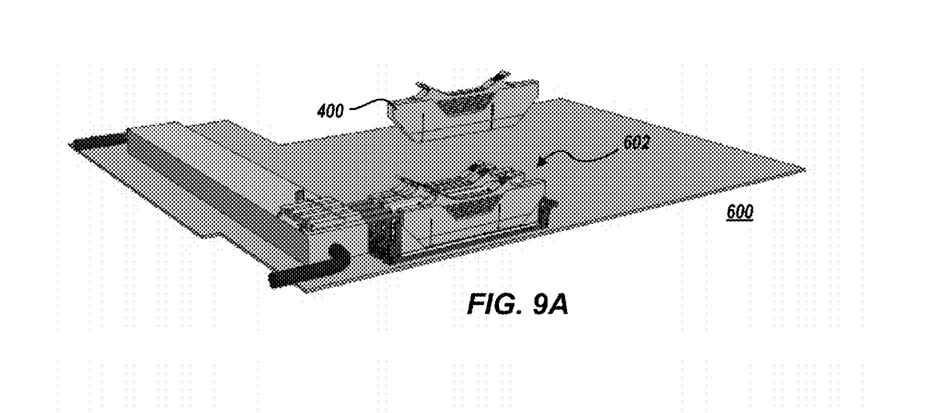
FIG. 9A-FIG. 9C depicts various views of method steps removing orthogonally hinged individualized memory module cooling system components, according to various embodiments of the present invention.
Figure 9B:
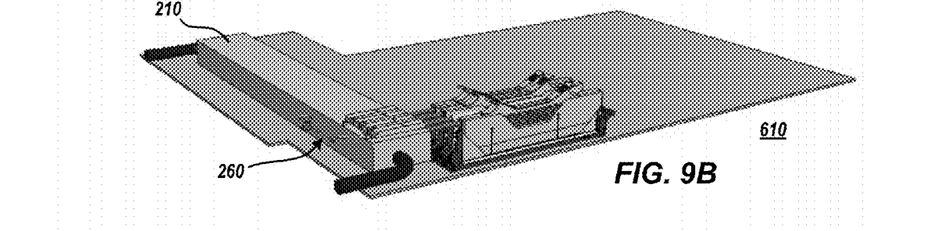
Figure 9C:
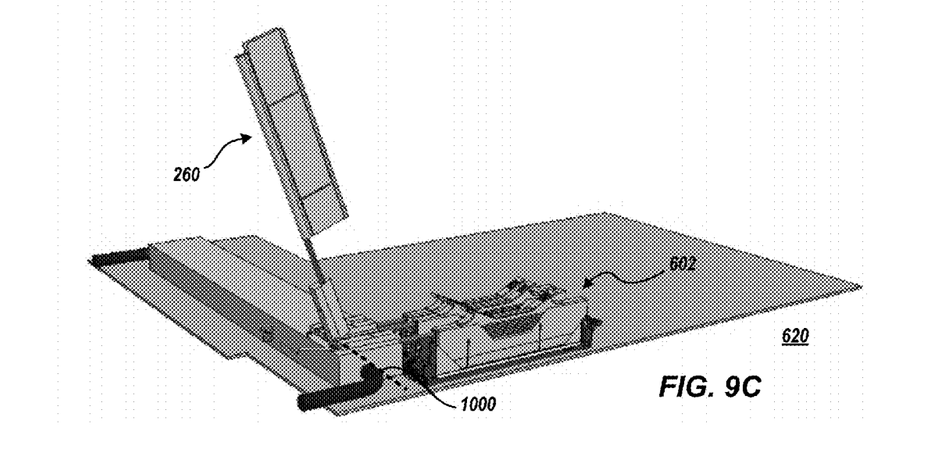

FIG. 9A-FIG. 9C depicts various views of method steps removing orthogonally hinged individualized memory module cooling system 10 components, according to various embodiments of the present invention. In certain embodiments, an inner memory module 602 (i.e. a memory module 300 seated in an inner connector 120, etc.) has failed or otherwise is identified for removal. In known memory module cooling systems, for example, the entire system may need to be powered down, the cooling path of all the memory modules would be disrupted in order to access the particular module, etc. However, utilizing orthogonally hinged individualized memory module cooling system 10 components, a memory module 300, such as an inner memory module 602 may be removed, or otherwise accessed, without disrupting the thermal path or heat transfer of one or more neighboring memory modules.

Therefore, in step 600, a memory module removal embodiment, as shown in FIG. 9A, compression sleeve 400 installed associated with the memory module removed. For example, a user may grab tabs 406 and vertically remove compression sleeve 400 from heat transfer assembly 250. In step 610, as shown in FIG. 9B, heat spreader retention system 260 is disengaged. For example, latch feature 264 is unlatched from retention support 213 and heat spreader retention system 260 is rotated away from base 270 such that traversing feature 261 no longer prevents the rotation of heat spreader assembly 250. In step 620, as shown in FIG. 9C, heat spreader assembly 250 is rotated about axis 1000 away from the memory module to allow for access to and removal of the memory module. As such, the orthogonally hinged individualized memory module cooling system 10 allows for juxtapositional contacts 1002 to be maintained between bases 270 and engagement features 211 of neighboring memory modules 300, heat spreader assemblies 250, etc. during the access or removal of a particular memory module. Further, the orthogonally hinged individualized memory module cooling system 10 maintains the thermal bonds between neighboring memory modules 300 and associated heat spreader assemblies 250 when a particular heat spreader assembly 250 is disengaged to allow for access to the associated memory module. In various embodiments, a memory module may be removed with steps 600, 610, 620, etc. without the need or use of removal tools. Therefore, the removal embodiments of steps 600, 610, 620, etc. may be referred to as a tool-less removal of a memory module from orthogonally hinged individualized memory module cooling system 10.

References herein to terms such as "vertical", "horizontal", etc. are made by way of example, and not by way of limitation, to establish a frame of reference. The term "horizontal" as used herein is defined as a plane parallel to the conventional plane or top surface of the system board, regardless of the actual spatial orientation of the electronic system. The term "vertical" refers to a direction perpendicular to the horizontal, as just defined. Terms, such as "on", "above", "below", "side", "top", "bottom", "higher", "lower", "over", "beneath", "under", etc. are defined with respect to the horizontal plane. It is understood that various other frames of reference may be employed for describing the present invention without departing from the spirit and scope of the present invention.

The invention claimed is:

1. A memory module cooling system comprising:
   a liquid cooled manifold assembly comprising a manifold, an liquid inlet, and a liquid outlet;
   a heat spreader assembly rotateably attached to the liquid cooled manifold assembly and about an axis perpendicular to a memory module, the heat spreader assembly comprising:
   a base in thermal contact with a heat pipe;
   a heat spreader in thermal contact with the heat pipe, the heat spreader being movable into and out of thermal engagement with the memory module by rotation of the heat spreader assembly about the axis perpendicular to the memory module; and
   a compression sleeve located on the heat spreader assembly,
   wherein the heat pipe extends through an opening along a length of the heat spreader, the heat pipe and heat spreader being movable together by the rotation of the heat spreader assembly.

2. The memory module cooling system of claim 1, wherein the compression sleeve is structured for compressing the heat spreader to increase thermal bonding between the heat spreader and memory module.

3. The memory module cooling system of claim 1, wherein the manifold comprises:
   a plurality of recessed engagement features, each recess engagement feature configured to accept the base.

4. The memory module cooling system of claim 3, wherein the heat spreader thermally engages the memory module by the base juxtapositionally contacting an associated recessed engagement feature.

5. The memory module cooling system of claim 1, further comprising:
   a heat spreader retention system rotatably attached to the manifold for preventing relative rotation between the heat spreader assembly and the liquid cooled manifold assembly.

6. The memory module cooling system of claim 2, wherein the compression sleeve includes a vertical alignment feature and wherein the heat spreader comprises a vertical alignment feature configured to engage with the compression alignment feature to force horizontal positioning and vertical installation direction for engaging compression sleeve upon heat spreader.

7. The memory module cooling system of claim 1, wherein thermal bonds are maintained between a plurality of neighboring memory modules when a particular heat spreader assembly is rotated away from an associated memory module.

8. The memory module cooling system of claim 1, wherein heat transfers from the memory module to the heat spreader, from the heat spreader to the heat pipe, from the heat pipe to the base, from the base to the manifold.

9. The memory module cooling system of claim 4, wherein the juxtapositionally contact allows for a majority of one or more perimeter surfaces of the base to be in thermal contact with engagement feature.

10. A memory module cooling system installation method comprising:
    seating a memory module to a system board assembly;
    rotating a heat spreader assembly relative to a liquid cooled manifold assembly about an axis perpendicular to the memory module, the heat spreader assembly comprising: a base in thermal contact with a heat pipe; and a heat spreader in thermal contact with the heat pipe, the heat spreader and the heat pipe being coupled together and being movable together to move the heat spreader into and out of thermal engagement with the memory module by rotating the heat spreader assembly about the axis perpendicular to the memory module, and;
    juxtapositionally contacting the base with a liquid cooled manifold assembly engagement recess feature, the manifold assembly comprising: a manifold, an liquid inlet, and a liquid outlet.

11. The memory module cooling system installation method of claim 10, further comprising:
    engaging a compression sleeve with the heat spreader to compress the heat spreader against the memory module.

12. The memory module cooling system installation method of claim 10, wherein juxtapositionally contacting further comprises:
    thermally engaging the memory module with an associated recessed engagement feature.

13. The memory module cooling system installation method of claim 10, further comprising:
    engaging a heat spreader retention system rotatably attached to the manifold to prevent relative rotation between the heat spreader assembly and the liquid cooled manifold assembly.

14. The memory module cooling system installation method of claim 11, wherein the compression sleeve comprises a vertical alignment feature and wherein the heat spreader comprises a vertical alignment feature configured to engage with the compression alignment feature to force horizontal positioning and vertical installation direction for engaging compression sleeve upon heat spreader.

15. The memory module cooling system installation method of claim 10, wherein the cooling system maintains thermal bonds between a plurality of neighboring memory modules when a particular heat spreader assembly is rotated away from an associated memory module.

16. The memory module cooling system installation method of claim 10, wherein heat transfers from the memory module to the heat spreader, from the heat spreader to the heat pipe, from the heat pipe to the base, from the base to the manifold.

17. The memory module cooling system installation method of claim 10, wherein the juxtapositionally contact allows for a majority of one or more perimeter surfaces of the base to be in thermal contact with engagement feature.

18. A memory module cooling system removal method comprising:
    removing a compression sleeve from a heat spreader of a heat spreader assembly, the heat spreader assembly comprising: a base in thermal contact with a heat pipe; and the heat spreader in thermal contact with the heat pipe, the heat spreader and the heat pipe being coupled together and being movable together to move the heat spreader into and out of thermal engagement with a memory module, and;
    rotating the heat spreader assembly relative to a liquid cooled manifold assembly about an axis perpendicular to the memory module to lift the heat spreader out of thermal engagement with the memory module, and;
    unseating the memory module from a system board assembly.

19. The memory module cooling system removal method of claim 18, wherein thermal bonds are maintained between a plurality of neighboring memory modules when a particular heat spreader assembly is rotated away from an associated memory module.

20. The memory module cooling system removal method of claim 18, further comprising:

disengaging a heat spreader retention system rotatably attached to the liquid cooled manifold assembly to prevent relative rotation between the heat spreader assembly and the liquid cooled manifold assembly.

\* \* \* \* \*